United States Patent
Pan et al.

(10) Patent No.: US 12,430,025 B2
(45) Date of Patent: Sep. 30, 2025

(54) PERFORMANCE MANAGEMENT USING INTELLIGENT PRIORITIZATION OF MEMORY OPERATIONS

(71) Applicant: Micron Technology, Inc., Boise, ID (US)

(72) Inventors: Lei Pan, Shanghai (CN); Qi Dong, Shanghai (CN)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 18/593,678

(22) Filed: Mar. 1, 2024

(65) Prior Publication Data
US 2024/0295962 A1  Sep. 5, 2024

Related U.S. Application Data

(60) Provisional application No. 63/488,351, filed on Mar. 3, 2023.

(51) Int. Cl.
*G06F 3/06* (2006.01)
(52) U.S. Cl.
CPC .......... *G06F 3/0607* (2013.01); *G06F 3/0659* (2013.01); *G06F 3/0679* (2013.01)
(58) Field of Classification Search
CPC .... G06F 3/0607; G06F 3/0625; G06F 3/0634; G06F 3/0659; G06F 3/0679; G11C 16/10
See application file for complete search history.

(56) References Cited

U.S. PATENT DOCUMENTS

| | | | | |
|---|---|---|---|---|
| 2009/0327588 | A1* | 12/2009 | Sutardja | G06F 3/0658 |
| | | | | 711/E12.008 |
| 2017/0269852 | A1* | 9/2017 | Lin | G06F 11/1044 |
| 2021/0034290 | A1* | 2/2021 | Hamilton | G06F 3/0679 |
| 2023/0359550 | A1* | 11/2023 | Muthiah | G06F 12/0246 |

* cited by examiner

Primary Examiner — Larry T Mackall
(74) Attorney, Agent, or Firm — Nicholson De Vos Webster & Elliott LLP

(57) ABSTRACT

Exemplary methods, apparatuses, and systems include an update performance manager for controlling performance of a wireless update by adjusting prioritization of internal operations for a memory subsystem. The update performance manager receives a first notification representing an initialization of a file transfer that includes an update file from a host using wireless communication. The update performance manager enters an update mode by reducing a priority of at least one internal operation of the memory subsystem in response to the first notification. The update performance manager receives the update file. The update performance manager programs the update file to memory. The update performance manager receives a second notification being a completion of the file transfer. The update performance manager resetting the priority of the at least one internal operation of the memory subsystem to a default value in response to the second notification.

20 Claims, 4 Drawing Sheets

PERFORMANCE MANAGEMENT USING INTELLIGENT PRIORITIZATION OF MEMORY OPERATIONS

CROSS-REFERENCE TO RELATED APPLICATION

The present application claims the benefit of U.S. Provisional Patent Application No. 63/488,351 filed on Mar. 3, 2023, which is incorporated by reference herein in its entirety.

TECHNICAL FIELD

The present disclosure generally relates to managing performance of programming updates in memory subsystems, and more specifically, relates to intelligent prioritization of memory operations.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
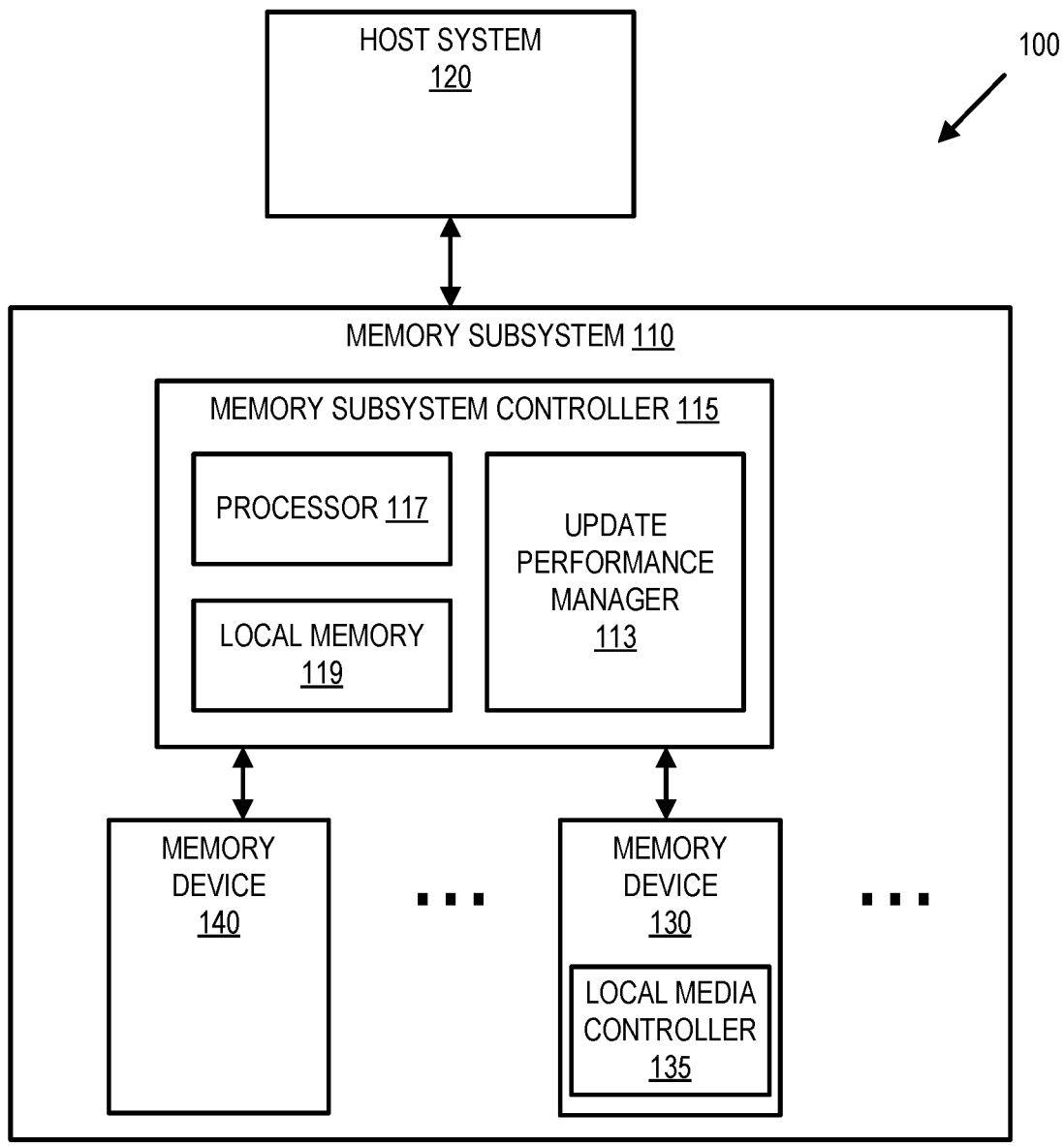
FIG. 1 illustrates an example computing system that includes a memory subsystem in accordance with some embodiments of the present disclosure.

Aspects of the present disclosure are directed to dynamically prioritizing internal operations of the memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), quad-level cells (QLCs), and octo-level cells (OLC). For example, an SLC can store one bit of information and has two logic states.

Operating environments for automotive technology systems have increasingly incorporated sophisticated driver systems and user experience features. The sophistication of these automotive systems can increase the amount of data required to update the driver systems and, accordingly, the length of time required to perform updates. When performing these updates, various features of the vehicle must be disabled for safety reasons. For example, performing over-the-air/wireless updates on large files such as disk images or applications, the vehicle is not able to be driven until completion of programming the update. In typical systems, the data is written while background processes such as maintenance, garbage collection, and internal data scans proceed as normal. As a result, these background processes increase the time to complete the programming. For large file sizes, the length of time required can delay or disrupt operation of the vehicle for extended periods.

Aspects of the present disclosure address the above and other deficiencies by operating the memory subsystem in a different mode that optimizes for programming the Over-The-Air (OTA) update. After receiving a request from a host to perform an OTA update, the memory subsystem deprioritizes internal operations and clears a buffer to provide optimized performance that reduces the time to program the OTA update. Additionally, the OTA update may be programmed using sequential blocks to optimize the read performance by the host during verification. As a result, the time to complete the update is reduced, which reduces the amount of time the operation of the vehicle is delayed or disrupted. Upon completion of the OTA update the operating mode is reset to normal operations.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random-access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes an update performance manager 113 that receives an update file from a host and controls the priority of the internal memory operations to optimize writing the update file to memory device(s) 130. In some embodiments, the controller 115 includes at least a portion of the update performance manager 113. For example, the controller 115 can include a processor 117 (processing device) configured to execute instructions stored in local memory 119 for performing the operations described herein. In some embodiments, the update performance manager 113 is part of the host system 120, an application, or an operating system.

The update performance manager 113 can receive update files from the host system 120. In an example, the update performance manager 113 receives a notification that represents an initialization of a file transfer that includes an update file from the host. In some embodiments, the update performance manager 113 and the host 120 communicate using a wireless communication protocol. Examples of the update file include images of one or more applications stored in the memory devices 130. The update performance manager 113 manages performance by controlling a priority of internal memory operations, such as garbage collection, data refresh, and data integrity scans, during an update. To determine the priority, the update performance manager 113 compares a performance requirement of each of the internal memory operations and assigns a priority from the highest performance requirement to the lowest performance requirement. For example, the operation of garbage collection may have a different performance requirement than a data integrity scan. The update performance manager 113 selects at least one internal operation for reduction in priority such as halting or deferring the selected internal operation for a time interval or until programming of the update file is complete.

The internal operations selected for reduction in priority may be selected using the assigned priority from the highest performance requirement to the lowest performance requirement.

In addition to reducing the priority of the selected internal operations, the update performance manager 113 configures a set of trim settings to program the update file to memory. To configure the set of trim settings, the update performance manager 113 determines if the current set of trim settings use the maximum available power. For example, the update performance manager 113 determines if the memory subsystem is operating in a power saving mode by checking for a performance throttling mode or another stored value that represents an external reduction in operating performance.

If the update performance manager 113 determines that the memory subsystem is operating in a power saving mode, the update performance manager 113 retains the current set of trim settings during programming of the update file. If the update performance manager 113 determines that the memory subsystem is not operating in a power saving mode (e.g., operating at maximum power), the update performance manager 113 adjusts at least one trim setting for programming the update file. For example, the update performance manager 113 selects a trim setting that increases the magnitude of a programming voltage pulse and/or reduces a time interval between programming voltage pulses. By selecting these trim settings, the update performance manager 113 reduces the latency between receipt of the update file and completion of programming the update file.

At completion of programming the update file to memory, the update performance manager 113 resets the priority of the internal operations of the memory subsystem to a default value. For example, upon completion of programming the update file to memory, the update performance manager 113 receives an additional notification from the host system 120 indicating that the file transfer is complete. In response to the additional notification or otherwise detecting the completion of the update, the update performance manager 113 restores priority of the internal operations that were reduced during the update performance manager to the nominal operating value.

Figure 2:
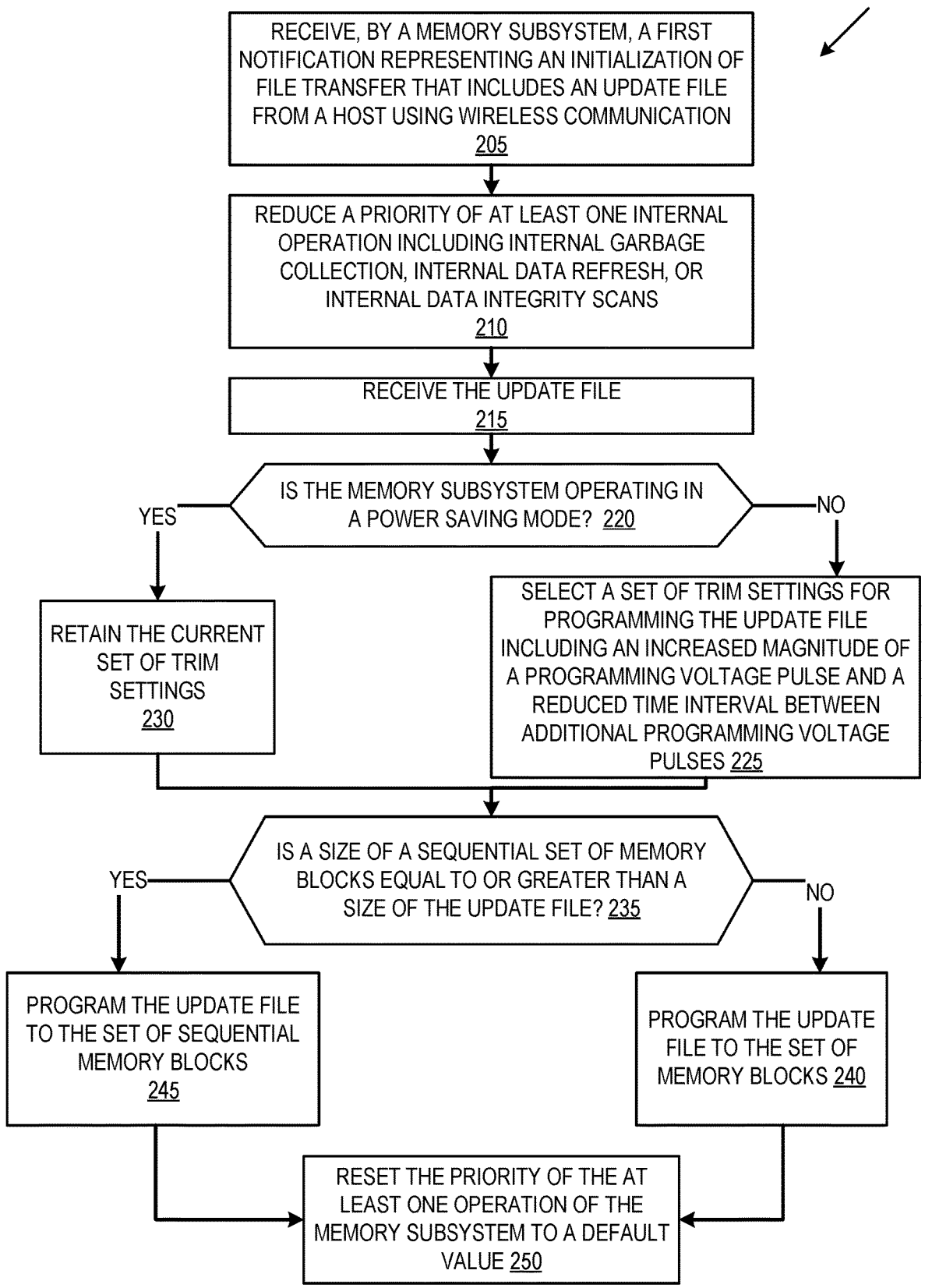
FIG. 2 is a flow diagram of an example method of dynamically prioritizing internal operations of the memory subsystem in accordance with some embodiments of the present disclosure.

FIG. 2 is a flow diagram of an example method of dynamically prioritizing internal operations of the memory subsystem in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the update performance manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the update performance manager 113 receives a first notification representing an initialization of the file transfer that includes an update file from a host using wireless communication. For example, the update performance manager 113 receives a request from the host system 120 to write a register that represents a status of an update mode. The update performance manager 113 receives a status value in the request that indicates the host system 120 is initializing a file transfer that includes an update file.

At operation 210, the update performance manager 113 reduces a priority of at least one internal operation including internal garbage collection, internal data refresh, or internal data integrity scans. For example, in response to receiving the first notification, the update performance manager 113 assigns a reduced priority to one or more of various internal memory operations. In one embodiment, the reduction in priority represents an order or magnitude of impact to the processing time of internal memory operation(s). At the greatest reduction in priority, the internal memory operation is halted until completion of programming the update file. At the lowest reduction in priority, the internal memory operation is reduced in frequency or speed of performance. The update performance manager 113 can apply different reductions to different internal operations. For example, the internal operation of data refresh may have a lower priority than the internal operation of data integrity scan. The update performance manager 113 selects at least one internal operation for reduction in priority until programming of the update file is complete. In some embodiments, the internal operations can be selected using a threshold priority or depending on the size of the update file. The threshold priority is a time value that corresponds to the magnitude of impact to processing time of the internal operations. For example, an internal operation that has a duration of 2 seconds with normal priority is selected for reduction in priority if the threshold priority is 1 second. For update files with a size greater than a threshold size, the update performance manager 113 reduces the priority of all internal operations.

At operation 215, the update performance manager receives the update file. For example, the update performance manager 113 receives a set of data bits from a host that constitute the content of the update file. For example, the update performance manager 113 can receive a data stream from the host system 120, the data stream including multiple sets of data bits (e.g., wordlines, pages, blocks, etc.) for writing to memory. Examples set forth herein refer to blocks, but other subdivisions of memory and other sets/groupings of data can be used.

At operation 220, the update performance manager 113 determines if the memory subsystem is operating in a power saving mode. For example, the update performance manager 113 checks one or more flags, indications, or register values that represent various power saving modes of the memory subsystem. If the update performance manager 113 determines that the memory subsystem is operating in the power saving mode, the method 200 proceeds to operation 230. If the update performance manager 113 determines that the memory subsystem is not operating in the power saving mode (e.g., operating a full power), the method 200 proceeds to operation 225.

At operation 225, the update performance manager 113 selects a set of trim settings for programming the update file including an increased magnitude of a programming voltage pulse and a reduced time interval between additional programming voltage pulses. For example, in response to determining that the memory subsystem is not operating in a power saving mode, the update performance manager 113 adjusts trim settings to decrease the latency (i.e., increase the programming speed and/or adjusting pulse count) of programming the update file to memory. For example, the update performance manager may adjust the voltage from a default programming voltage value to a maximum programming voltage value, such as 3 Volts. In some embodiments, the magnitude of the increase is defined by a profile of the host system 120 using the historical write speeds and latency requirements of the host system 120.

At operation 230, the update performance manager 113 retains the current selection of trim settings. For example, if the update performance manager 113 determines that the memory subsystem is operating in a power saving mode, the update performance manager 113 does not adjust the current selection of trim settings. In some embodiments, the update performance manager 113 notifies the host system 120 that the memory subsystem is operating in a power saving mode.

At operation 235, the update performance manager 113 determines if a size of a sequential set of memory blocks is equal to or greater than the size of the update file. For example, the update performance manager 113 compares a size of the update file to a size of a number of memory blocks that are available for sequential programming. If the size of the number of memory blocks that are available for sequential programming is greater than the size of the update file, the method 200 proceeds to operation 245. If the size of the number of memory blocks that are available for sequential programming is less than the size of the update file, the method 200 proceeds to operation 240. In an example, in response to the update performance manager 113 determining that the update file cannot be written entirely to sequential memory blocks, the update performance manager 113 programs the update file to memory blocks that are not sequential.

At operation 240, the update performance manager 113 programs the update file to the set of memory blocks. For example, the update performance manager 113 programs the update file to a set of non-sequential blocks in memory of the set of memory blocks such as by performing a random write for the bits of the update file.

At operation 245, the update performance manager 113 programs the update file to the set of sequential memory blocks. For example, for an update file of 20 GB, the update performance manager 113 programs the bits of the update file into a number of sequential blocks that is equal to 20 GB of memory. To program the update file in sequential memory blocks, the update performance manager 113 allocates the set of sequential memory blocks representing a size equal to or greater than a size of the update file and writes the bits of the update file to the set of sequential memory blocks.

At operation 250, the update performance manager 113 resets the priority of the internal operation(s) of the memory subsystem to a default value. After completion of programming the bits of the update file at operations 240 or 245, the update performance manager 113 resets the priority of the internal operations that had priority reductions at operation 210. In some embodiments, the update performance manager 113 resets the priority in response to receiving an additional notification from the host system 120. The additional notification from the host system 120 indicates that the host system 120 has completed the file transfer.

After resetting the priority of the internal operations, if the method 200 proceeded through operation 240 and the update file is not in sequential blocks, an internal data move is initiated to relocate portions of the update file to create a set of sequential blocks for the update file. If the method 200 proceeded through operation 245 instead, the update file is programmed in sequential blocks and the internal data move can be omitted. In some embodiments, after resetting the priority of internal operations, the set of trim settings are restored to a default setting. After resetting the priority of the internal operations, the internal operations of the memory subsystem are re-initialized at the default value of priority.

Figure 3:
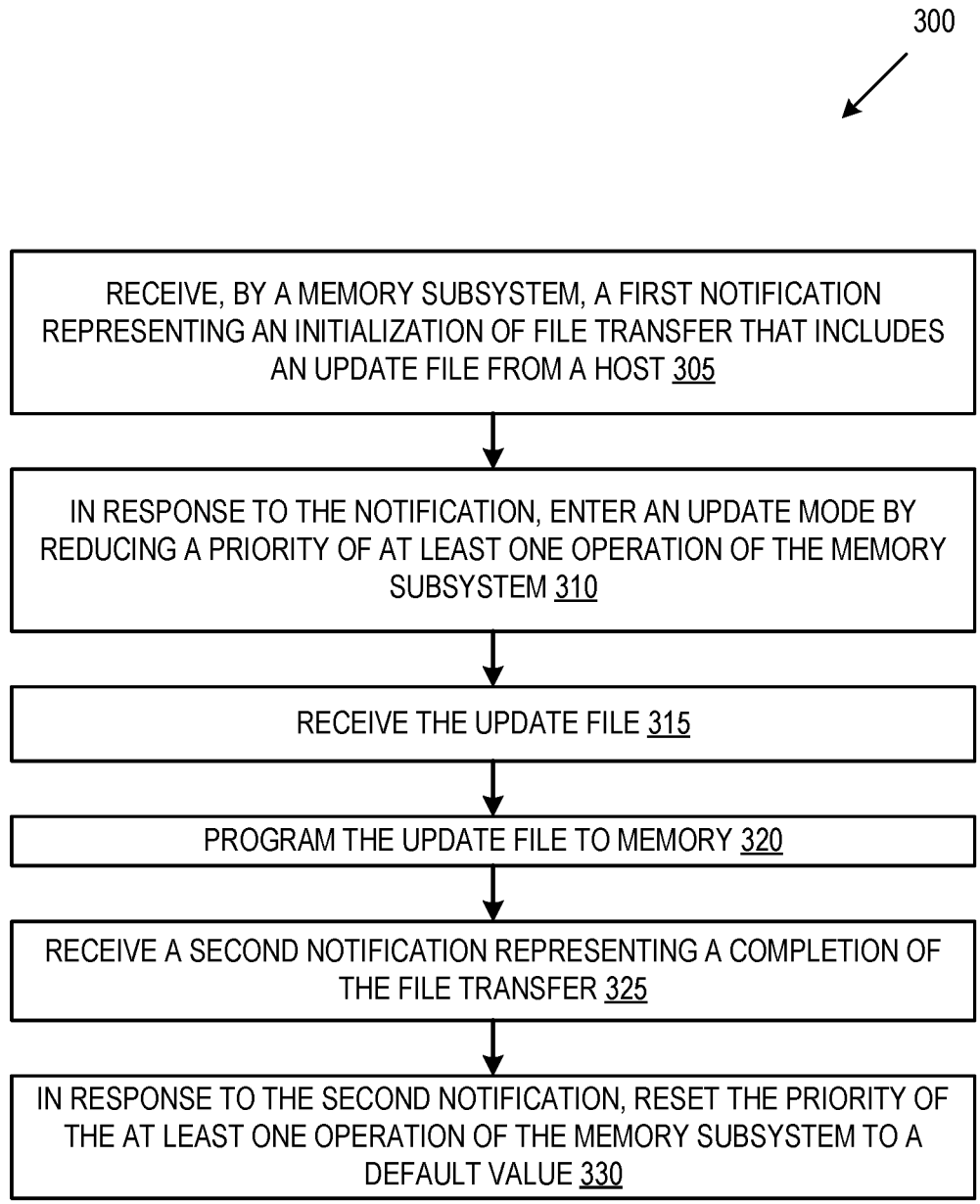
FIG. 3 is a flow diagram of an example method of intelligent prioritization of memory operations in accordance with some embodiments of the present disclosure.

FIG. 3 is a flow diagram of an example method of intelligent prioritization of memory operations in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the update performance manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the update performance manager 113 receives a first notification representing an initialization of file transfer that includes an update file from a host. As described above at operation 205, the update performance manager 113 is communicatively coupled to a network interface device that receives communication from the host system.

At operation 310, the update performance manager 113 enters an update mode by reducing a priority of at least one internal operation of the memory subsystem. As described above at operations 210, the update performance manager 113 assigns a reduced priority to one or more of various internal memory operations in response to receiving the first notification at operation 305.

At operation 315, the update performance manager 113 receives the update file. As described above at operation 215, the update performance manager 113 is communicatively coupled to a network interface device that receives communication from the host system to receive file transfers using wireless communication.

At operation 320, the update performance manager programs the update file to memory. As described above at operations 240 or 245, the update performance manager programs the update file to a set of blocks in memory. As described above, the update performance manager can perform a sequential or a random write for the bits of the update file depending on the availability of sequential memory blocks.

At operation 325, the update performance manager receives a second notification representing the completion of the file transfer. As described above, the second notification is received from the host system indicating that the file transfer is complete.

At operation 330, the update performance manager resets the priority of the at least one internal operation of the memory subsystem to a default value in response to the second notification received at operation 325. As described above at operation 250, the priority of each internal operation that had priority reductions are restored and the internal operations are re-initialized at the default value of priority.

Figure 4:
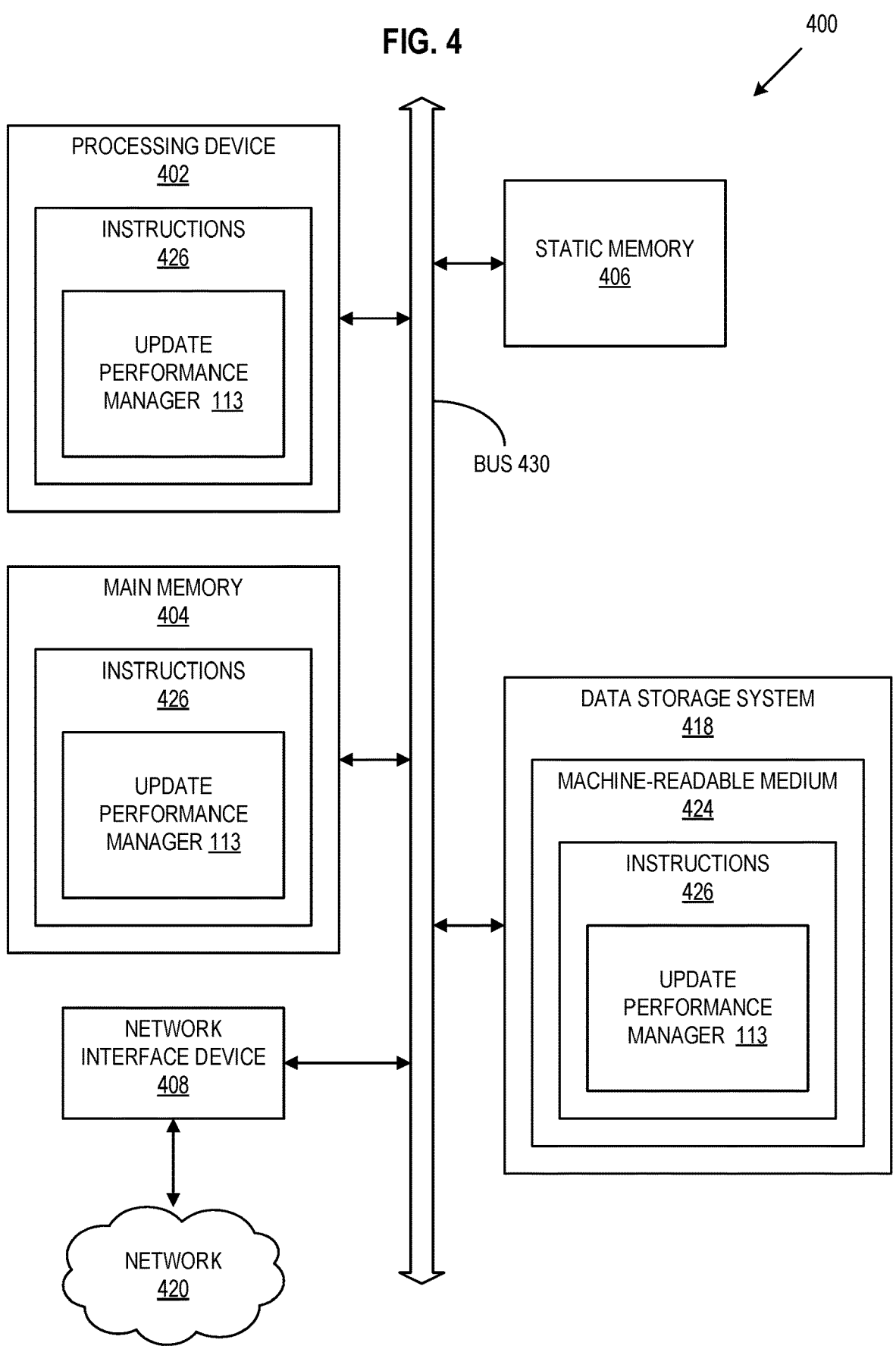
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to update performance manager 113 of FIG. 1). In alternative embodiments, the machine can be connected (e.g., networked) to other machines in a LAN, an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random-access memory (DRAM) such as synchronous DRAM (SDRAM) or Rambus DRAM (RDRAM), etc.), a static memory 406 (e.g., flash memory, static random-access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory subsystem 110 of FIG. 1.

In one embodiment, the instructions 426 include instructions to implement functionality corresponding to a wireless update performance manager (e.g., the update performance manager 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 200 and 300 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving, by a memory subsystem, a first notification representing an initialization of file transfer that includes an update file from a host;
   in response to the first notification, entering an update mode by reducing a priority of at least one internal operation of the memory subsystem;
   receiving the update file;
   selecting a set of trim settings including an increased magnitude of a programming voltage pulse and/or a reduced time interval between additional programming voltage pulses;
   programming the update file to memory using the set of trim settings;
   receiving a second notification representing a completion of the file transfer; and
   in response to the second notification, resetting the priority of the at least one internal operation of the memory subsystem to a default value.

2. The method of claim 1 wherein reducing a priority of at least one internal operation of the memory subsystem comprises halting internal garbage collection, internal data refresh, and internal data integrity scan operations.

3. The method of claim 1, wherein programming the update file to memory comprises:
   allocating a set of sequential memory blocks for programming the update file, the set of sequential memory blocks representing a size equal to or greater than a size of the update file; and
   programming the update file to the set of sequential memory blocks.

4. The method of claim 3, further comprising initiating, in response to resetting the priority of the at least one internal operation of the memory subsystem to a default value, the at least one internal operation of the memory subsystem at the default value of priority.

5. The method of claim 1, wherein programming the update file to memory comprises:
   determining that a set of memory blocks, representing a size equal to or greater than a size of the update file, are not sequential; and
   programming the update file to the set of memory blocks.

6. The method of claim 5, wherein the at least one internal operation includes an internal data refresh operation that re-allocates at least a portion of the memory subsystem by allocating a set of sequential memory blocks for programming the update file, the set of sequential memory blocks representing a size equal to or greater than a size of the update file.

7. The method of claim 1, further comprising:
selecting the at least one internal operation of the memory subsystem using a threshold priority and/or a size of the update file.

8. A non-transitory computer-readable storage medium comprising instructions that, when executed by a processing device, cause the processing device to:
receive a first notification representing an initialization of file transfer that includes an update file from a host using wireless communication;
in response to the first notification, enter an update mode by reducing a priority of at least one internal operation of a memory subsystem;
receive the update file;
select a set of trim settings including an increased magnitude of a programming voltage pulse and/or a reduced time interval between additional programming voltage pulses;
program the update file to memory using the set of trim settings;
receive a second notification representing a completion of the file transfer; and
in response to the second notification, reset the priority of the at least one internal operation of the memory subsystem to a default value.

9. The non-transitory computer-readable storage medium of claim 8 wherein to reduce a priority of at least one internal operation of the memory subsystem, the processing device is caused to halt internal garbage collection, internal data refresh, and internal data integrity scan operations.

10. The non-transitory computer-readable storage medium of claim 8, wherein to program the update file to memory, the processing device is further caused to:
allocate a set of sequential memory blocks for programming the update file, the set of sequential memory blocks representing a size equal to or greater than a size of the update file; and
program the update file to the set of sequential memory blocks.

11. The non-transitory computer-readable storage medium of claim 10, wherein in response to resetting the priority of the at least one internal operation of the memory subsystem to a default value, the at least one internal operation of the memory subsystem are initiated at the default value of priority.

12. The non-transitory computer-readable storage medium of claim 8, wherein to program the update file to memory the processing device is cause to:
determine that a set of memory blocks, representing a size equal to or greater than a size of the update file, are not sequential; and
program the update file to the set of memory blocks.

13. The non-transitory computer-readable storage medium of claim 12, wherein the at least one internal operation includes an internal data refresh operation that re-allocates at least a portion of the memory subsystem by allocating a set of sequential memory blocks for programming the update file, the set of sequential memory blocks representing a size equal to or greater than a size of the update file.

14. The non-transitory computer-readable storage medium of claim 8, wherein the processing device is further caused to:
select the at least one internal operation of the memory subsystem using a threshold priority and/or a size of the update file.

15. A system comprising:
a plurality of memory devices; and
a processing device, operatively coupled with the plurality of memory devices, to:
receive a first notification representing an initialization of file transfer that includes an update file from a host using wireless communication;
in response to the first notification, enter an update mode by reducing a priority of at least one internal operation of a memory subsystem, wherein to reduce a priority of at least one internal operation of the memory subsystem, the processing device is caused to halt internal garbage collection, internal data refresh, or internal data integrity scan operations;
receive the update file;
select a set of trim settings including an increased magnitude of a programming voltage pulse and/or a reduced time interval between additional programming voltage pulses;
program the update file to memory using the set of trim settings;
receive a second notification representing a completion of the file transfer; and
in response to the second notification, reset the priority of the at least one internal operation of the memory subsystem to a default value.

16. The system of claim 15, wherein to program the update file to memory, the processing device is further caused to:
allocate a set of sequential memory blocks for programming the update file, the set of sequential memory blocks representing a size equal to or greater than a size of the update file; and
program the update file to the set of sequential memory blocks.

17. The system of claim 16, wherein in response to resetting the priority of the at least one internal operation of the memory subsystem to a default value, the at least one internal operation of the memory subsystem are initiated at the default value of priority.

18. The system of claim 15, wherein to program the update file to memory the processing device is cause to:
determine that a set of memory blocks, representing a size equal to or greater than a size of the update file, are not sequential; and
program the update file to the set of memory blocks.

19. The system of claim 15, wherein the at least one internal operation includes an internal data refresh operation that re-allocates at least a portion of the memory subsystem by allocating a set of sequential memory blocks for programming the update file, the set of sequential memory blocks representing a size equal to or greater than a size of the update file.

20. The system of claim 15, wherein the processing device is further caused to:
select the at least one internal operation of the memory subsystem using a threshold priority and/or a size of the update file.

* * * * *